(12) United States Patent
Lee et al.

(10) Patent No.: US 8,335,905 B2
(45) Date of Patent: Dec. 18, 2012

(54) COMPUTING SYSTEM INCLUDING PROCESSOR AND MEMORY WHICH GENERATES WAIT SIGNAL WHEN ACCESSING DETERIORATED MEMORY AREA

(75) Inventors: Byeonghoon Lee, Seoul (KR); Ki Hong Kim, Suwon-si (KR); Hyuck Jun Cho, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 521 days.

(21) Appl. No.: 12/558,628

(22) Filed: Sep. 14, 2009

(65) Prior Publication Data

US 2010/0115220 A1    May 6, 2010

(30) Foreign Application Priority Data

Nov. 4, 2008  (KR) ................. 10-2008-0108964

(51) Int. Cl.
*G06F 12/00* (2006.01)
(52) U.S. Cl. ........ 711/173; 711/103; 711/114; 711/112; 711/E12.008; 365/185.33
(58) Field of Classification Search ................... 711/173
See application file for complete search history.

(56) References Cited

U.S. PATENT DOCUMENTS

| | | | | |
|---|---|---|---|---|
| 5,668,976 A | * | 9/1997 | Zook | 703/24 |
| 2004/0015649 A1 | * | 1/2004 | Chang | 711/103 |
| 2005/0024978 A1 | * | 2/2005 | Ronen | 365/232 |
| 2006/0161805 A1 | * | 7/2006 | Tseng et al. | 714/6 |
| 2007/0183179 A1 | | 8/2007 | Maeda et al. | |
| 2008/0184086 A1 | * | 7/2008 | Kim et al. | 714/746 |
| 2010/0031082 A1 | * | 2/2010 | Olster | 714/7 |

FOREIGN PATENT DOCUMENTS

| | | |
|---|---|---|
| JP | 11031102 A | 2/1999 |
| JP | 2003256269 A | 9/2003 |
| KR | 1020060055518 A | 5/2006 |

* cited by examiner

*Primary Examiner* — Hashem Farrokh
*Assistant Examiner* — Larry Mackall
(74) *Attorney, Agent, or Firm* — Volentine & Whitt, PLLC

(57) ABSTRACT

A computing system includes; a memory having first and second storage areas, and a processor sending a memory control signal to the memory to define a data access period during which data is accessed, and a read source control signal indicating whether the first storage area or the second storage area is to be accessed during the data access period. The memory activates a wait signal in response to the memory access signal and the read source control signal, and the processor is further configured to adjust the duration of the data access period in response to the wait signal.

19 Claims, 8 Drawing Sheets

COMPUTING SYSTEM INCLUDING PROCESSOR AND MEMORY WHICH GENERATES WAIT SIGNAL WHEN ACCESSING DETERIORATED MEMORY AREA

CROSS-REFERENCE TO RELATED APPLICATION

This U.S. non-provisional patent application claims priority under 35 U.S.C §119 to Korean Patent Application No. 10-2008-0108964 filed Nov. 4, 2008, the subject matter of which is hereby incorporated by reference.

BACKGROUND

The present inventive concept relates to a computing system including a memory and a processor. Computing systems generally include a memory configured to store data and a processor controlling the memory. The processor may take many different forms (e.g., a microprocessor, a Central Processing Unit (CPU), an Application Specific Integrated Circuit (ASIC), or a memory controller). However specifically configured, the processor communicates data access requests (e.g., read, write or erase operations) to the memory to store data, change stored data, or retrieve stored data.

The memory is responsive to such data access requests. For example, during a read operation, the processor transfers a command, an address, and control signals to the memory. The memory performs a read operation in response to the command, address and control signals. Resulting "read data" retrieved from memory is then returned to the processor or some other circuit within a host system. During many types of read operations, the processor is configured to receive the requested read data from memory following some predetermined "read time" delay.

SUMMARY

Embodiments of the inventive concept are directed to a computing system capable of controlling a data access period for a memory in view of memory cell deterioration.

In one embodiment, the inventive concept provides a computing system comprising; a memory comprising a first storage area and a second storage area, and a processor configured to send a memory control signal to the memory to define a data access period during which data is accessed, and a read source control signal indicating whether the first storage area or the second storage area is to be accessed during the data access period, wherein the memory activates a wait signal in response to the memory access signal and the read source control signal, and the processor is further configured to adjust the duration of the data access period in response to the wait signal.

In another embodiment, the inventive concept provides a computing system comprising; a memory comprising memory cells operating in a normal state when a number of executed program/erase operations is less than a threshold value, and operating in a deteriorated state when the number of executed program/erase operations is greater than the threshold value, and a processor configured to control overall operation of the memory, wherein the processor define a normal data access period when the memory cells are operating in the normal state and an extended data access period when the memory cells are operating in the deteriorated state, the normal data access period being defined in relation to a chip selection signal provided by the processor, and the extended data access period being defined in relation to the chip selection signal and a wait signal returned to the processor from the memory when the memory cells are operating in the deteriorated state.

BRIEF DESCRIPTION OF THE DRAWINGS

Non-limiting and non-exhaustive embodiments will be described with reference to the following figures, wherein like reference numbers and labels refer to like or similar elements, unless otherwise specified. In the drawings.

DETAILED DESCRIPTION OF THE EMBODIMENTS

Figure 1:
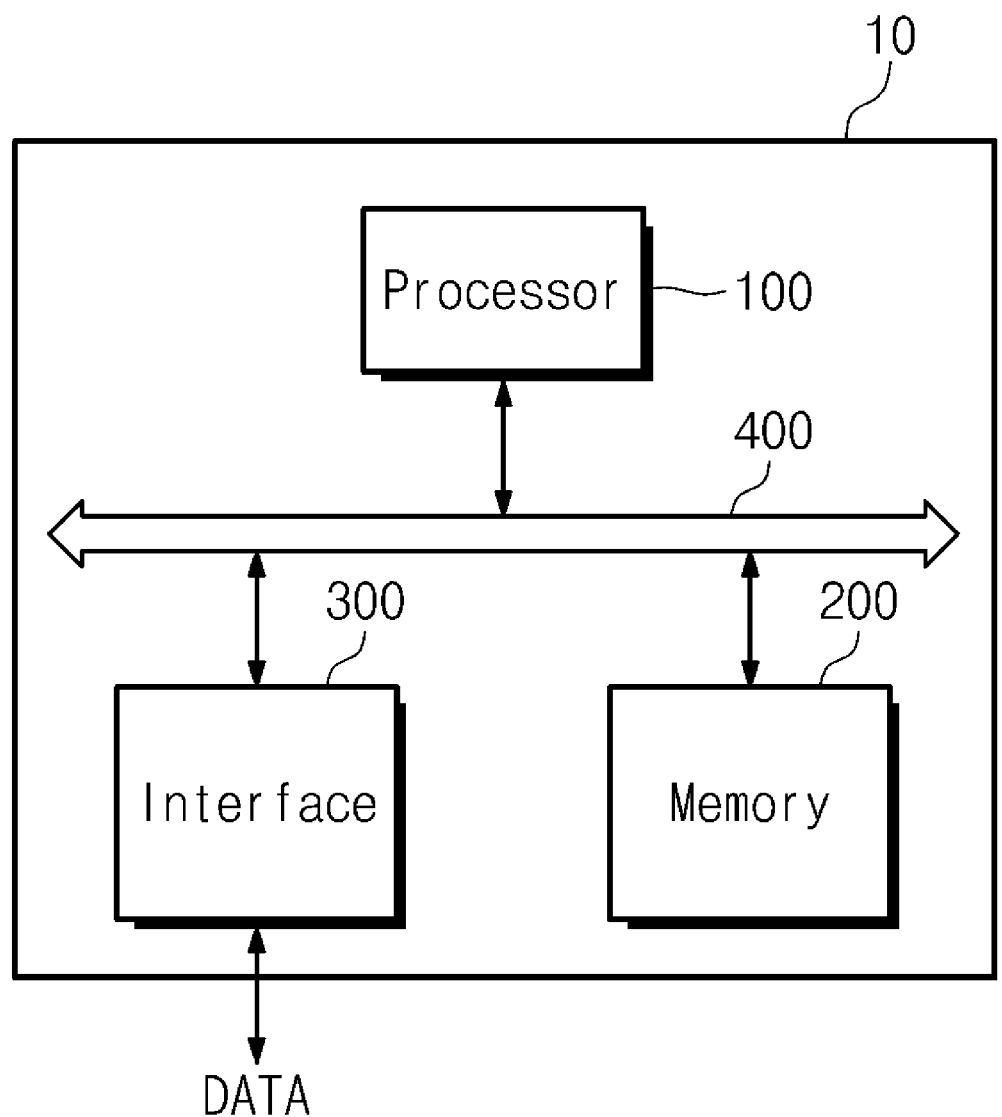
FIG. 1 is a general block diagram of a computing system according to an embodiment of the inventive concept.

FIG. 1 is a general block diagram showing a computing system 10 according to an embodiment of the inventive concept. Referring to FIG. 1, computing system 10 includes a processor 100, a memory 200, an interface 300, and a system bus 400.

The processor 100 controls the overall operation of the computing system 10. The processor 100 is configured to access the data storage capabilities of the memory 200 via the system bus 400. The processor 100 is further configured to exchange data with external circuitry (not shown) via the system bus 400 and/or the interface 300.

In certain embodiments of the inventive concept, the memory 200 comprises volatile memory such as SRAM, DRAM, SDRAM, or the like. Alternatively or additionally, the memory 200 may comprise non-volatile memory such as ROM, PROM, EPROM, EEPROM, flash memory, PRAM, MRAM, RRAM, FRAM, or the like. The memory 200 may be configured to communicate via the system bus 400 according to one or more conventionally understood data communication protocols, such as AMBA, USB, MMC, PCI-E, ATA, Serial-ATA, Parallel-ATA, SCSI, ESDI, IDE, and the like.

In one embodiment of the inventive concept, the computing system 10 is configured as a smart card or memory card capable of exchanging data with external circuitry, such as a smart card reader or similar terminal device (e.g., a PC).

Where the computing system 10 is configured as a memory card or smart card, the processor 100 controls the overall operation of the memory 200 and interface 300 in such a manner that a security circuit (or security software—e.g., data encryption/decryption software) may be incorporated within the card. The processor 100 may control the security circuit (not shown) or execute the security software, as is conventionally understood.

In a more specific embodiment of the inventive concept, the computing system 10 may be configured as a microprocessor-based smart card, and as such, may perform necessary data processing, data communication, and security related computations and operations. In a more specific embodiment of the inventive concept, the computing system 10 comprises a user-interactive smart card capable of bi-directional communication of data via the interface 300.

Hereafter, certain embodiments of the inventive concept will be described in some additional detail with reference to accompanying drawings. However, the inventive concept may be variously embodied and should not be construed as being limited to only the illustrated embodiments. The various exemplary embodiments that follow may be incorporated into the general computing system of FIG. 1.

Figure 2:
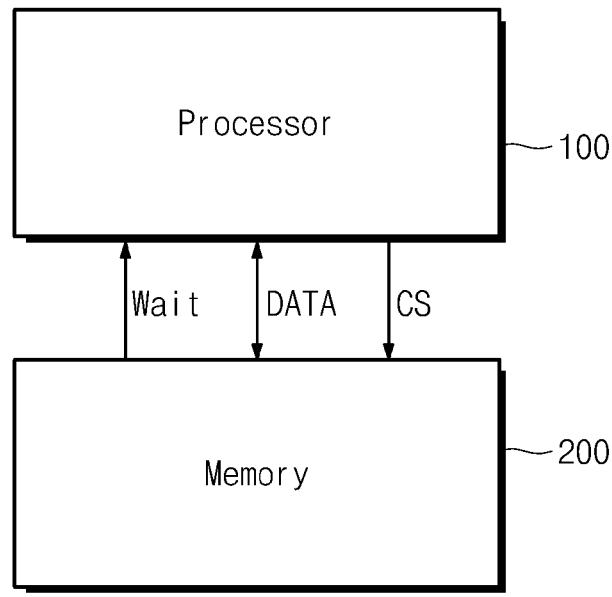
FIG. 2 is a block diagram further illustrating the memory and processor of FIG. 1 in one embodiment of the inventive concept.

FIG. 2 is a block diagram further illustrating one embodiment of the processor and memory of FIG. 1. Referring to FIG. 2, the processor 100 is configured to exchange control signals (e.g., "Wait" and control signal "CS"), as well as data and address information with the memory 200. The processor 100 provides the memory control signal CS to memory 200 when accessing data. In one embodiment of the inventive concept, the control signal CS is a chip selection signal that operates as a data access signal (or memory device actuation signal) sent to memory 200. However, the memory control signal CS is not limited to only this type of signal. The memory control signal CS may take many forms ranging from a single bit to a data packet. However, defined the memory control signal CS defines an "active" state for various circuitry within memory involved in data access operations. Thus, the memory control signal CS is said to define an active "data access period" within the memory 200.

Activation, receipt, or transition of the chip selection signal CS by the memory 200 often initiates the data access period. In certain embodiments of the inventive concept, an address and/or a command associated with the "accessed data" (e.g., read data, write data, or data to be erased) is communicated to the memory 200 along with the chip selection signal CS. The indicated data access operation then begins. During some initial portion of the data access operation, the memory 200 may send a Wait signal to the processor 100. The Wait signal (or similarly defined busy signal) is often returned to processor 100 from the memory 200 upon receiving the chip selection signal CS. The processor 100 may then define (i.e., control or adjust) the active data access period in response to the Wait signal.

Figure 3:
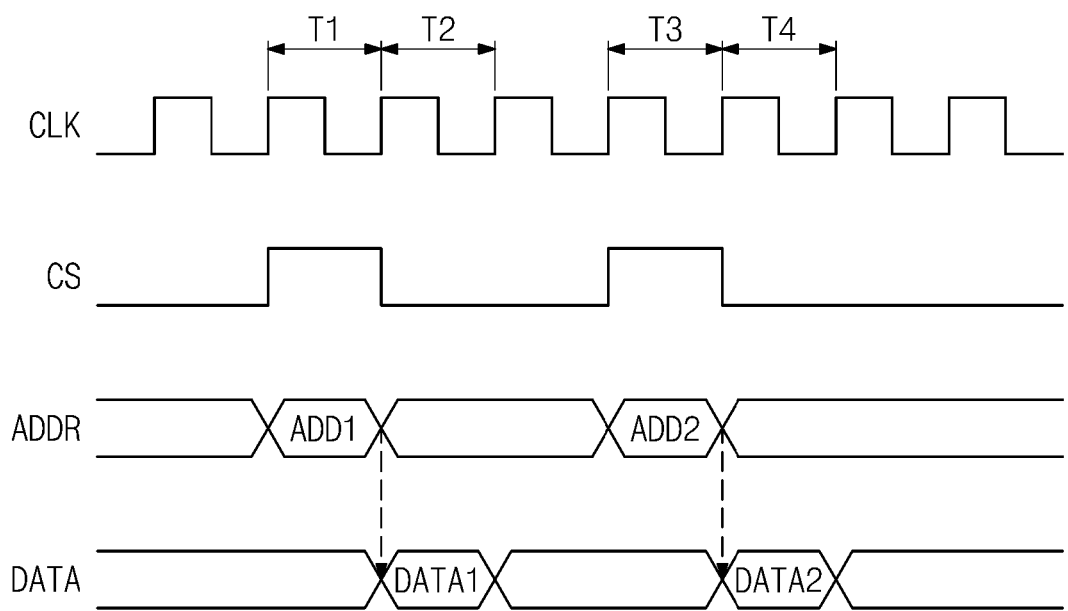
FIG. 3 is a timing diagram further illustrating one embodiment of a read operation executed by the processor and memory of FIG. 2.

FIG. 3 is a timing diagram further illustrating one possible read operation executed by the processor 100 and memory 200 of FIG. 2. Referring to FIG. 3, a system clock CLK, a chip selection signal CS, an address ADDR, and data are illustrated.

Referring to FIGS. 2 and 3, during a first time period T1, the chip selection signal CS accessing the memory 200 is activated and a first address ADD1 is sent to memory 200 from processor 100. That is, a first data access request is issued to memory 200 from processor 100. During the first time period T1, the memory 200 performs the indicated data access operation in response to the first address ADD1 and the chip selection signal CS. During a subsequent "data transfer period" T2, first read data DATA1 is transferred from memory 200 to the processor 100.

During a third time period T3, the chip selection signal CS is again activated and a second address ADD2 is sent to memory 200 from the processor 100. That is, during the third time period T3, a second data access request is issued to memory 200 from the processor 100. As before, during the third time period T3, the memory 200 performs the indicated data access operation in response to the second address ADD2 and the chip selection signal CS. Then, during a subsequent data transfer period T4, second read data DATA2 is transferred from memory 200 to the processor 100.

While successive read operations are illustrated in FIG. 3, other types of operations might alternately be illustrated.

Whether read, write (or "program"), or erase operations are executed, certain types of memory cells forming the constituent memory cell array in memory 200 deteriorate over time, as many operations essentially wear-out the cells. For example, it is assumed the memory cells of memory 200 include a transistor having a charge storing layer, and that memory 200 performs a program operation using a mechanism such as charge accumulation (or trapping) on a charge storing layer via F-N tunneling, or charge injection in a charge storing layer via the hot electron injection. Under these assumptions, the memory 200 may perform an erase operation using such a mechanism wherein the accumulated/trapped/injected charge is discharged from the charge storing layer via F-N tunneling.

As program and erase operations are repeatedly performed by the memory 200, charge may be trapped in an insulation layer between the charge storing layer and the constituent semiconductor bulk. This operationally induced phenomenon causes the threshold voltage of the effected memory cells to increase. Thus, when a constant voltage is applied to a word line connected to an effected memory cell, its channel is functionally smaller than normal (i.e., non-exhausted) memory cells.

Figure 4:
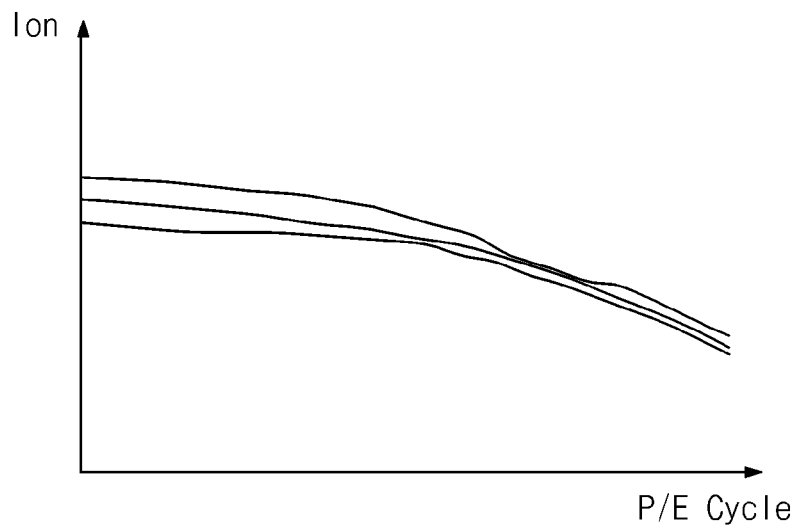
FIG. 4 is a graph showing the magnitude of ON-cell current as a function of an increasing number of program/erase (P/E) cycles.

FIG. 4 is a graph illustrating the magnitude of ON-cell current as a function of a number of program/erase cycles performed for a memory having the foregoing characteristics. In FIG. 4, the horizontal axis indicates a number of program/erase cycles, and the vertical axis indicates the magnitude of ON-cell current (in amperes). Referring to FIG. 4, the ON-cell current for a memory cell generally decreases with the number of program/erase cycles.

During a read operation, a read voltage is applied to a word line and a bit line is charged with a bit line voltage. A memory cell having a first state (e.g., a program state) is turned OFF in response to application of the read voltage. If the memory cell is turned OFF, the bit line will float. This enables a voltage level on the bit line to be maintained at the bit line voltage.

In contrast, a memory cell having a second state (e.g., an erase state) is turned ON in response to the application of the read voltage. If the memory cell is turned ON, the bit line is grounded through the memory cell. This allows any charge accumulated on the bit line to be discharged through the memory cell. Thus, the voltage level on the bit line may decrease below the bit line voltage. Accordingly, it is possible to determine the logic state of the memory cell by applying the read voltage to the memory cell and detecting the resulting variation in the voltage level of the bit line.

The ON-cell current is a measure of the current flowing through the channel of an ON memory cell when a read voltage is applied to its word line. As illustrated in FIG. 4, if the memory cell is deteriorated, its channel is effectively reduced in size. This means the ON-cell current will be decreased. This decrease in ON-cell current gives rise to a decrease in the amount of current flowing through a memory cell programmed in the second state. This result tends to reduce the operating speed where the voltage level of the bit line is decreased from the normal bit line voltage. In other words, the corresponding data access period for the memory 200 is increased to a period greater than the defined active period (e.g., first time period T1 and third time period T3) for the chip selection signal CS.

Figure 5:
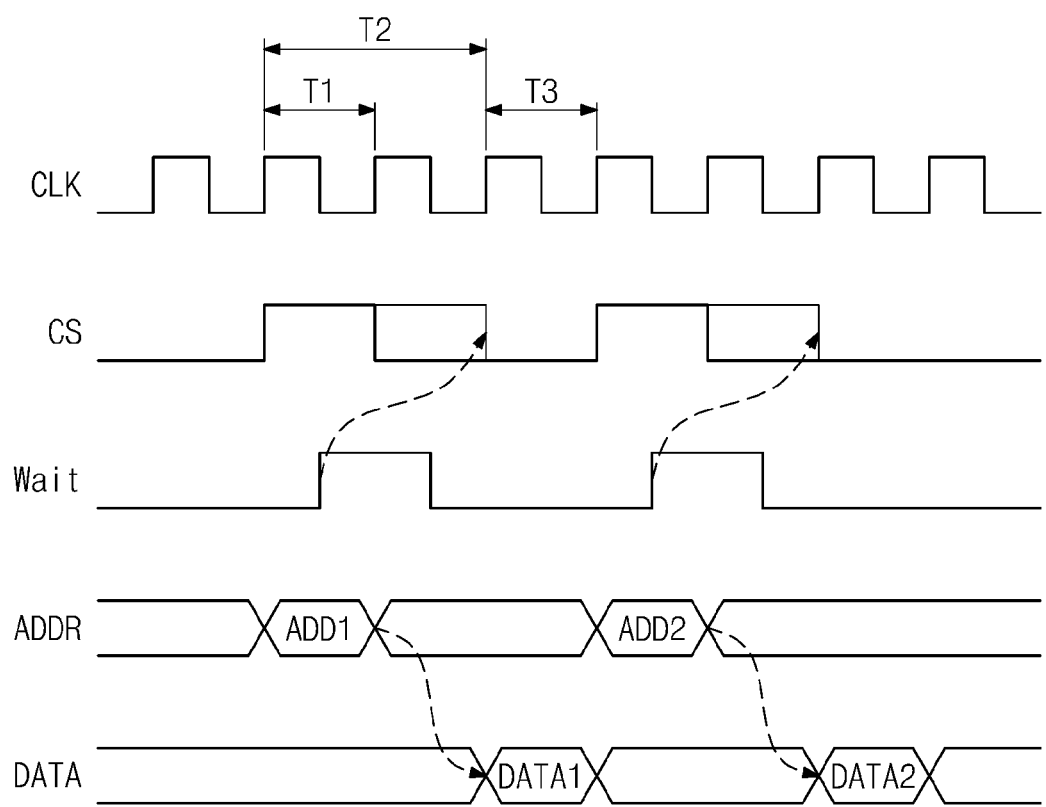
FIG. 5 is a timing diagram further illustrating another embodiment of a read operation executed by the processor and memory of FIG. 2.

FIG. 5 is a timing diagram further illustrating a read operation executed by the processor 100 and memory 200 of FIG. 2. In the illustrated embodiment of the inventive concept shown in FIG. 5, the data access period for the memory 200 is assumed to be longer than one cycle of the clock CLK, but shorter than the two cycles of the clock CLK due to deterioration of the memory cells in the memory 200.

Referring to FIGS. 2 and 5, since the chip selection signal CS active period T1 (i.e., one cycle of the clock CLK) is shorter than the data access period required by the memory 200, the memory 200 activates the Wait signal in response to the chip selection signal CS. The processor 100 then controls (adjusts) the active period for the chip selection signal CS in response to the Wait signal to defined an "extended data access period" or time period T2 (e.g., two cycles of the clock CLK in the illustrated example) instead of the "normal data access period" or period T1 (e.g., one cycle of the CLK) of FIG. 3. The memory 200 then performs the requested read operation during the extended data access period T2 according to the applied chip selection signal CS. Since the active period defined by the chip selection signal CS is extended, the read operation directed to deteriorated memory cells may nonetheless proceed without significant risk of read error within the extended active period T2. Read data is then returned to the processor 100 during a subsequent "data transfer period" T3.

The memory 200 may be further configured to compare a data access (or active) period defined by the chip selection signal CS with a reference data access period stored in memory 200 in order to generate the Wait signal. In particular, if the duration of the active period defined by the chip selection signal CS is less than the reference data access period stored in the memory 200, then the memory 200 generates the Wait signal.

For example, it is assumed that the memory 200 initially stores a reference data access period of 30 ns, but an extended data period of 60 ns is required to execute a read operation due to the deteriorated state of certain memory cells. Further, it is assumed that a frequency of the clock CLK is 30 MHz. In such a case, the clock CLK has a period of about 33 ns. Thus, consistent with the foregoing examples, the chip selection signal CS is initially activated during one cycle of the clock CLK, or 33 ns.

So long as the actual data access period for the memory 200 successfully falls within the normal data access period (i.e., one clock cycle of 33 ns), as defined by the chip selection signal CS, the normal data access timing is used, and the memory 200 does not generate the Wait signal. Under this assumption, the processor 100 and memory 200 are said to operate in normal read mode and in a manner consistent with the example of FIG. 3.

However, in the event that the actual data access period required by the memory 200 to execute a read operation is greater than the current active period defined by the chip selection signal CS due to deterioration of the memory cells in memory 200 (i.e., longer than one cycle of the CLK or 33 ns), but is less than two cycles of the CLK or 66 ns, the extended data access period is required and the applied duration of the chip selection signal CS is extended by generation of the Wait signal. Thus, consistent with the foregoing, the active period defined by the chip selection signal CS is controlled by the Wait signal and extends out to two cycles of the clock CLK, or 66 ns. With adjustment of the data access period in relation to the Wait signal, the processor 100 and memory 200 may operate in the same manner as described with reference to FIG. 5.

The foregoing adjustment in data access period is clearly a matter of clock frequency. For example, using all of the foregoing assumptions except now assuming that the frequency of the clock CLK is 1 MHz (i.e., a clock having period of about 66 ns), no Wait signal need be generated since the normal data access period (now 66 ns) is sufficient to execute a read operation, even with deteriorated memory cells. Thus, the processor 100 and memory 200 may operate in the same manner as described with reference to FIG. 3.

Figure 6:
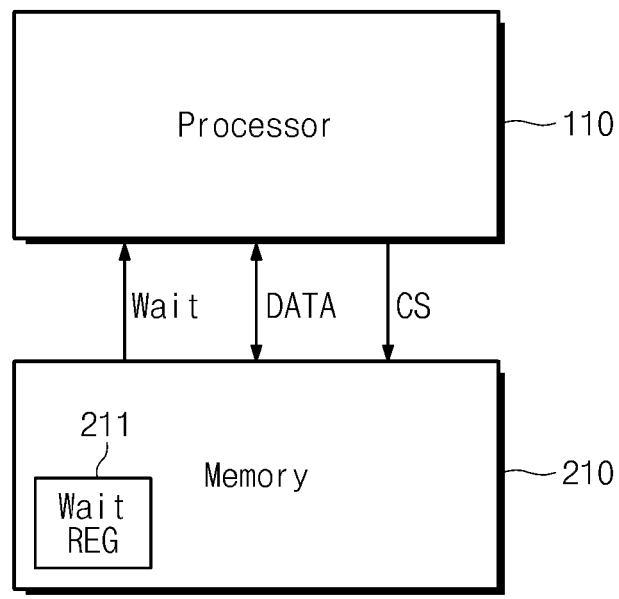
FIG. 6 is a block diagram further illustrating the processor and memory of FIG. 1 in another embodiment of the inventive concept.

FIG. 6 is a block diagram further illustrating the processor and memory of FIG. 1 in another embodiment of the inventive concept. Referring to FIG. 6, a processor 110 is identical with that described in FIG. 2, except it comprises a register 211. The register 211 stores data defining the duration of the "current data access period" being used in the memory 210.

For example, the register 211 may store a number of executed program/erase cycles for memory cells or groups of memory cells within the memory 210. The memory 210 may select a current data access period from a plurality of data access periods defined by data stored in the register 211. For example, in a case the number of executed program/erase cycles stored in the register 211 is less than a defined threshold value, the data access period selected as the current data access period for the memory 210 will be shorter than the normal active period defined by the chip selection signal CS. In such a case, no Wait signal will be generated.

However, if the number of executed program/erase cycles stored in the register 211 is greater than the threshold value, a selected, current data access period for the memory 210 may be longer than the normal active period for the chip selection signal CS. Thus, the Wait signal must be generated to extend the duration of the chip selection signal CS, thereby defining an extended data access period. That is, the processor 110 will adjust the active period for the chip selection signal CS in response to the activated Wait signal. As above, the processor 110 may thus readily control the active period of the chip selection signal CS to have a period twice as long as its normal active period. In this manner, read operation execution may be optimized in view of memory cells operating in a deteriorated (yet viable) state.

Figure 7:
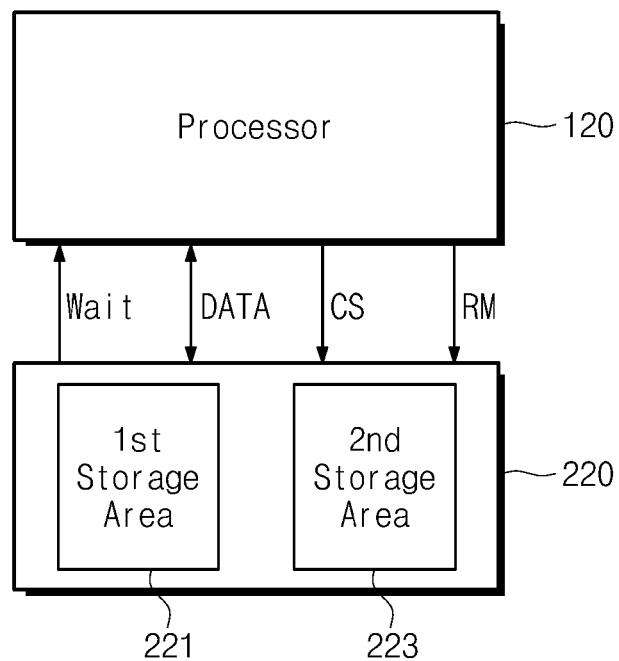
FIG. 7 is a block diagram further illustrating the processor and memory of FIG. 1 in yet another embodiment of the inventive concept.

FIG. 7 is a block diagram further illustrating the processor and memory of FIG. 1 in another embodiment of the inventive concept. Referring to FIG. 7, a memory 220 comprises a first storage area 221 and a second storage area 223. The first and second storage areas 221 and 223 may be similarly configured to store data. That is, if the first storage area 221 is configured with single level (binary data) memory cells, then the second storage area 223 will also be configured with single level memory cells. And if the first storage area 221 is configured with multi level (multiple N-bit) memory cells, then the second storage area 223 will also be configured with multi level memory cells.

Assuming that code data is stored in the first storage area 221 and user data (or payload data) is stored in the second storage area 223. The number of program/erase operations directed to the first storage area 221 may be less than the number directed to the second storage area 223. Thus, memory cells in the second storage area 223 may deteriorate more quickly than memory cells in the first storage area 221.

It is assumed by way of example that the first and second storage areas 221 and 223 of memory 220 initially operate with a normal active period of 20 ns, but that following a threshold number of program/erase operations the memory cells in the second storage area 223 deteriorate and require a longer data access period (i.e., greater than 20 ns, but less than 40 ns)—assuming a clock frequency of 50 MHz. However, the memory cells of the first storage area 221 are less deteriorated than the second storage area 223. So, while the data access period for the second storage area 223 may be extended per the foregoing, the normal data access period for the first storage area 221 may be maintained. Thus, the first storage area 221 may be accessed during only a single clock cycle (20 ns), while the second storage area 223 is accessed during an extended data access period (e.g., 40 ns).

To accomplish this outcome, while enhancing overall data access speed, the processor 120 provides memory 220 with a "read source" control signal "RM" indicating whether data stored in the first storage area 221 or the second storage area 223 is being accessed by a particular read operation. Under the foregoing assumptions, the processor 120 thus indicates to the memory 220 whether code data or user data is being accessed by means of the read source control signal RM. In certain embodiments of the inventive concept, the read source control signal RM may be part of the command communicated from the processor 100 to the memory 200.

For example, in a case where the processor 120 accesses the second storage area 223, that is, when the processor 120 accesses user data, the read source control signal RM is activated. In a case where the processor 120 accesses the first storage area 221, that is, when the processor 120 accesses code data, the read source control signal RM is deactivated. The memory 220 operates responsive to the read source control signal RM and the chip selection signal CS. Thus, under the foregoing assumptions, in the event that the processor 120 accesses the first storage area 221, the memory 220 will deactivate the Wait signal. In the event that the processor 120 accesses the second storage area 223, the memory 220 will activate the Wait signal.

Figure 8:
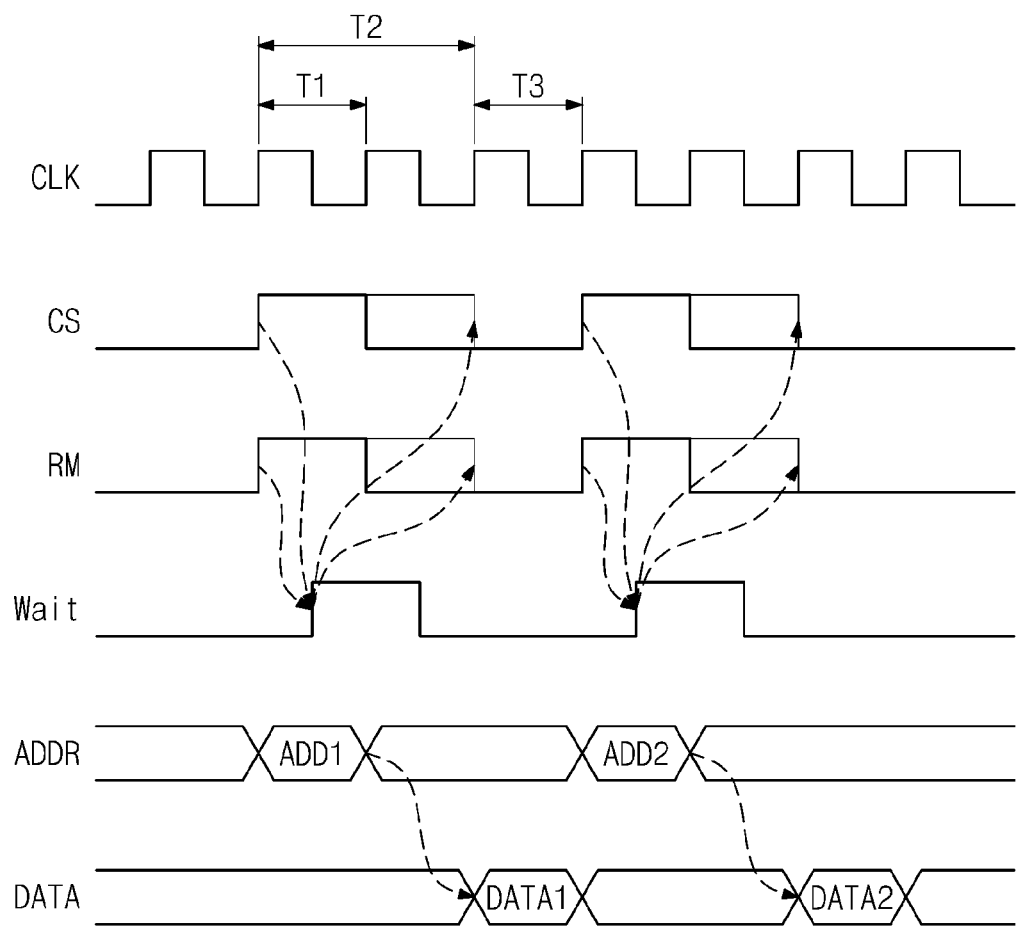
FIG. 8 is a timing diagram further illustrating another embodiment of a read operation executed by the processor and memory of FIG. 7.

FIG. 8 is a timing diagram further illustrating a read operation executed between the processor and memory of FIG. 7 in accordance with an embodiment of the inventive concept. In FIG. 8, the read source control signal RM is additionally illustrated over previous timing diagram examples.

Referring to FIGS. 7 and 8, the chip selection signal CS is activated during a period T1. That is, the processor 120 accesses a memory 220 during the period T1. A read source control signal RM is also activated during the period T1. That is, during the period T1, the processor 120 accesses the second storage area 223 of the memory 220. In other words, during the period T1, the processor 120 accesses user data stored in the memory 220. During the period T1, an address ADD1 is transferred to the memory 220 from the processor 120.

An active period of the chip selection signal CS corresponds to the period T1 (for example, 20 ns). Since the read source control signal RM is activated, the processor 120 accesses the second storage area 223. If the second storage area 223 is deteriorated, it has an access period longer than the active period T1 (corresponding to one cycle of the CLK, 20 ns), as defined by the chip selection signal CS. In a case where the second storage area 223 is deteriorated, the memory 220 activates the Wait signal, such that the second storage area 223 is accessed. That is, the memory 220 generates the Wait signal in response to the chip selection signal CS and the read source control signal RM.

The processor 120 controls the active period of the chip selection signal CS in response to the Wait signal. For example, the processor 120 increases the active period of the chip selection signal CS by a multiple (for example, twice). The active period of the chip selection signal CS is increased from the period T1 (corresponding to one cycle of the CLK, 20 ns) to the period T2 (corresponding to two cycles of the CLK, 40 ns). Accordingly, although the second storage area 223 is deteriorated, it is possible to access the second storage area 223 within the period T2 (corresponding to two cycles of the CLK, 40 ns) where the chip selection signal CS is activated. During a period T3, user data DATA1 read from the second storage area 223 is transferred to the processor 120.

Figure 9:
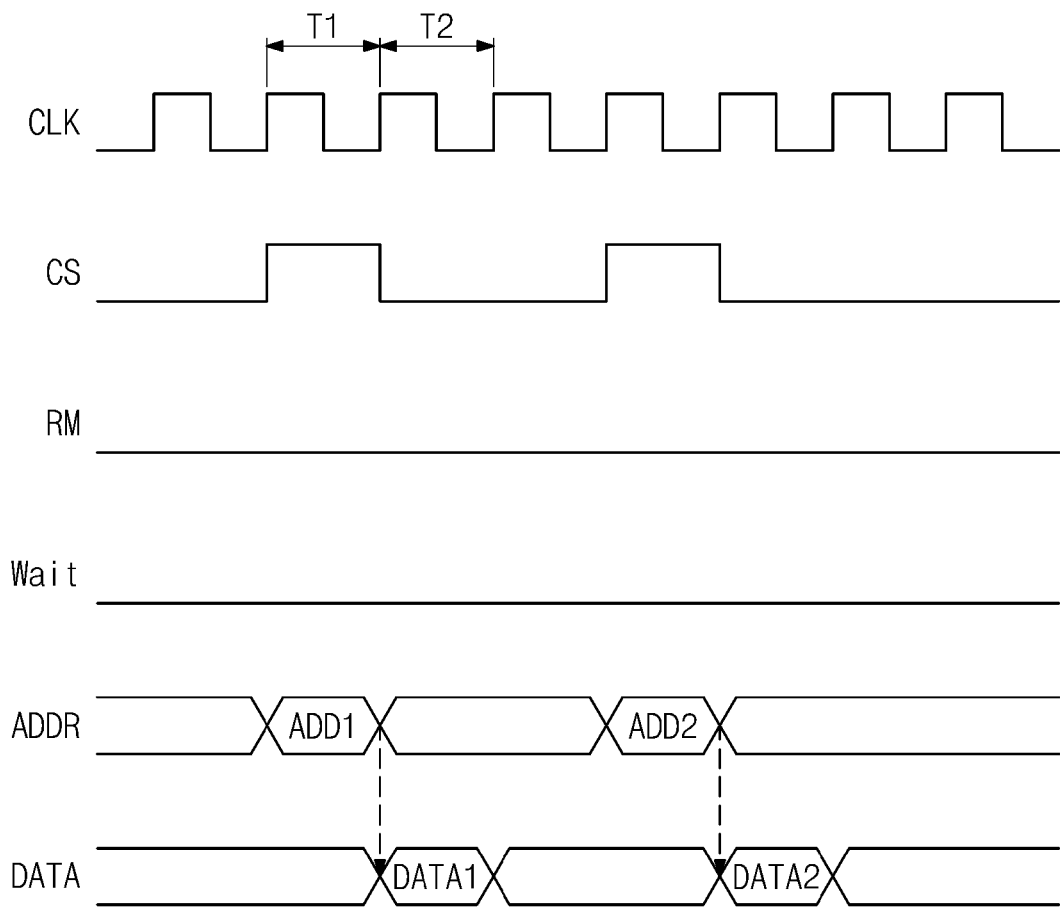
FIG. 9 is a timing diagram further illustrating yet another embodiment of a read operation executed by the processor and memory of FIG. 7

FIG. 9 is a timing diagram further illustrating a read operation executed between the processor and memory of FIG. 7 according to another embodiment of the inventive concept.

Referring to FIGS. 7 and 9, during a period T1, the chip selection signal CS is activated. That is, the processor 120 accesses the memory 220. During the period T1, the control signal RM is maintained at an inactive state. That is, the processor 120 accesses the first storage area 221 of the memory 220. In other words, the processor 120 accesses code data stored in the memory 220. During the period T1, the address ADD1 is transferred to the memory 220 from the processor 120.

An active period of the chip selection signal CS corresponds to the period T1 (corresponding to one cycle of the clock CLK, 20 ns). Since the control signal RM is inactivated, the processor 120 accesses the first storage area 221. Although the first storage area 221 is deteriorated, it has an access period shorter than the active period T1 (corresponding to one cycle of the clock CLK, 20 ns) of the chip selection signal CS.

Thus, the memory 220 holds the Wait signal inactive in response to the chip selection signal CS and the read source control signal RM. That is, the processor 120 maintains the active period of the chip selection signal CS with the period T1 (corresponding to one cycle of the CLK, 20 ns). Accordingly, although the first storage area 221 is at a deteriorated state, the first storage area 221 is capable of being accessed within the period T1 where the chip selection signal CS is activated. During a period T2, data DATA1 read from the first storage area 221 is sent to the processor 120.

The memory 220 activates the Wait signal when the active period T1 of the chip selection signal CS is shorter than the access period of the second storage area 223 (for example, it is longer than 20 ns and shorter than 40 ns) and the read source control signal RM indicates accessing to the second storage area 223. The processor 120 adjusts the active period of the chip selection signal CS in response to the Wait signal. For example, the processor 120 adjusts the active period of the chip selection signal CS to be extended from its initial (or normal) value (that is, T1). For example, the processor 120 responds to the Wait signal and adjusts the active period of the chip selection signal CS so as to be increased by a multiple of its initial value (that is, T1) (e.g., twice). The active period of the chip selection signal CS is increased from the period T1 (corresponding to one cycle of the CLK, 20 ns) to the period T2 (corresponding to two cycles of the CLK, 40 ns). The second storage area 223 is accessed during the active period T2 of the chip selection signal CS.

As described above, a computing system 10 of FIG. 1 according to an embodiment of the inventive concept comprises a memory 220 having the first storage area 221 and the second storage area 223; and a processor 120 transferring the read source control signal RM to the memory 220 during a data access operation and activating a chip selection signal CS for accessing the memory 220. The read source control signal RM indicates whether or not to access one of the first and second storage areas 221 and 223. The memory 220 activates the Wait signal in response to the signals CS and RM, and the processor 120 adjusts an active period of the chip selection signal CS in response to the control signal Wait.

Different access speeds are provided in relation to the first storage area 221 storing code data and the second storage area 223 storing user data, respectively. For example, a fast read speed is provided to a code storage area as compared with a data storage area. A read speed of the code storage area becomes a critical factor, and the degree of deterioration of the code storage area is less than that of the data storage area.

In particular, in case of a computing system such as a smart card, a processor 120 and a memory 220 are integrated within one semiconductor chip. Due to the degree of integration and complexity of design, the memory 220 (for example, a NOR flash memory) 220 of the smart card is divided into a code storage area and a user data storage area. Different read speeds are provided to a plurality of storage areas which are not separated physically and have different access periods, respectively. Thus, it is understood that a code access speed of the computing system is improved. Further, it is understood that the present inventive concept is not limited to a smart card.

Below, it is assumed that an access period of each of the first and second storage areas 221 and 223 of the memory 220 is shorter than 20 ns at an initial state and that with the second storage area 223 deteriorated, its access period is longer than 20 ns and shorter than 40 ns. An access period of the first storage area 221 is shorter than 20 ns, even with the first storage area deteriorated. It is further assumed that a frequency of a clock CLK provided to the processor 120 and the memory 220 is 25 MHz. In this case, the clock CLK has a period of 40 ns.

Although a program/erase operation is carried out at the first storage area 221, the access period of the first storage area 221 may be maintained to be less than 20 ns. That is, although the first storage area 221 is deteriorated, the access period (less than 20 ns) of the first storage area 221 is shorter than the active period T1 (corresponding to one cycle of the CLK, 40 ns). That is, it is possible to access the first storage area 221 within one cycle of the clock CLK.

If a program/erase cycle number of the second storage area 223 is over a threshold value, the access period of the second storage area 223 may be longer than 20 ns and shorter than 40 ns. That is, although the second storage area 223 is deteriorated, the access period (being longer than 20 and shorter than 40) of the second storage area 223 is shorter than the active period T1 (corresponding to one cycle of the CLK, 40 ns) of the chip selection signal CS. Accordingly, it is possible to access the second storage area 223 within one cycle (40 ns) of the clock CLK.

Since the first and second storage areas 221 and 223 are accessed within one cycle of the clock CLK, the memory 220 maintains the control signal Wait at an inactive state regardless of whether the read source control signal RM is activated. That is, the memory 220 inactivates the Wait signal when the active period T1 (corresponding to one cycle of the CLK, 40 ns) of the chip selection signal CS is longer than the access period (for example, being longer than 20 ns and shorter than 40 ns) of the second storage area 223.

As described above, the processor 120 and the memory 220 provide an access speed corresponding to a deterioration state of the memory 220. If a storage area of the memory 220 is divided into a plurality of storage areas and the plurality of storage areas has different deterioration states, respectively, the processor 120 and the memory 220 provide each storage area with an access speed corresponding to a deterioration state of each storage area. Thus, it is understood that the code storage area being deteriorated relatively less than the user data storage area is set to have a higher access speed than that the user data storage area. By providing different access signal active periods to the user data storage area and the code storage area, a fast access speed is provided to the code storage area, and an access speed corresponding to a deterioration state is provided to the user data storage area.

Figure 10:
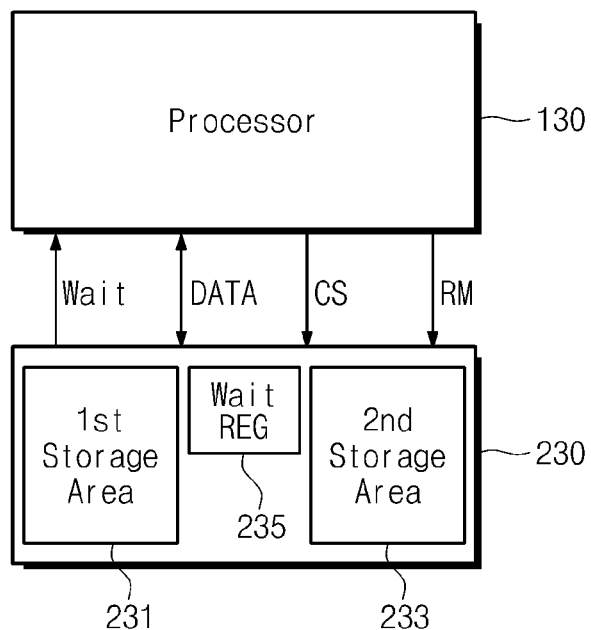
FIG. 10 is a block diagram further illustrating the processor and memory of FIG. 1 in yet another embodiment of the inventive concept.

FIG. 10 is a block diagram further illustrating the processor and memory of FIG. 1 in another embodiment of the inventive concept. A processor 130 in FIG. 10 is configured identically with a processor 120 in FIG. 7, except it further comprises a register 235.

The register 235 stores an access period of the second storage area 233 in the memory 230. For example, the register 235 may store a program/erase cycle number of the second storage area 233. The memory 230 may determine an access period with reference to the register 235. In a case where a program/erase cycle number stored in the register 235 is less than a predetermined value, the access period of the second storage area 233 may be shorter than the active period T1 (corresponding to one cycle of a clock CLK) of a chip selection signal CS. Although activated chip selection signal CS and read source control signal RM are sent to the memory 230 from the processor 130, the Wait signal may be maintained at an inactive state.

For example, if a program/erase cycle number stored in the register 235 is over a predetermined value, the access period of the second storage area 233 is longer than the active period T1 (corresponding to one cycle of the clock CLK) of the chip selection signal CS. The memory 230 may activate the Wait signal in response to activated chip selection signal CS and read source control signal RM from the processor 130. The processor 130 may adjust the active period T1 in response to the activated Wait signal. For example, the processor 130 controls the active period of the chip selection signal CS so as to have twice a period T2 (corresponding to two cycles of the CLK) as compared with an initial value T1 (corresponding to one cycle of the CLK).

That is, the memory 230 further comprises a register 235 storing information for an access period of the second storage area 233. In the event that the read source control signal RM indicates accessing to the second storage area 233, the memory 230 compares the access period of the second storage area 233 and the active period of the chip selection signal CS to determine whether the Wait signal is activated.

As described above, the memory 230 includes the register 235. Thus, it is possible to selectively activate the control signal Wait according to a deterioration state of the second storage area 233. If a program/erase cycle number of the second storage area 233 is less than a predetermined value, the second storage area 233 is accessed by use of the chip selection signal CS having the active period T1 corresponding to one cycle of the clock CLK. If the program/erase cycle number of the second storage area 233 is more than the predetermined value, the second storage area 233 is accessed by use of the chip selection signal CS having the active period T2 corresponding to two cycles of the clock CLK. That is, it is understood that there is provided an access speed of the second storage area 233 optimized according to a deterioration state of the second storage area 233.

Figure 11:
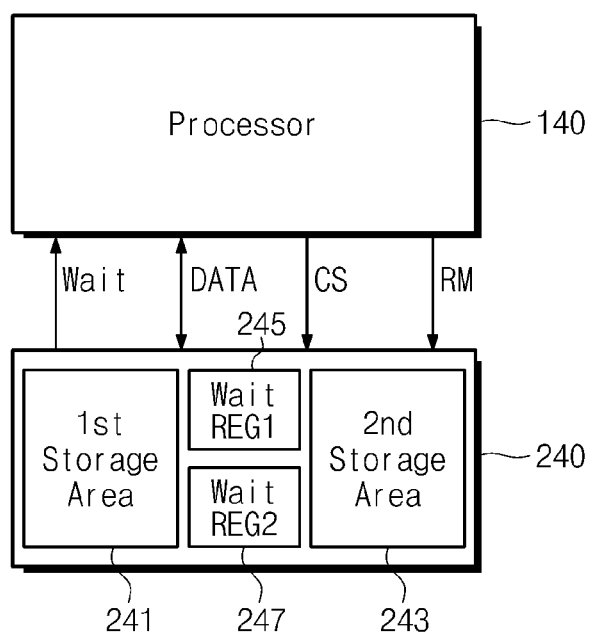
FIG. 11 is a block diagram further illustrating the processor and memory of FIG. 1 in still another embodiment of the inventive concept.

FIG. 11 is a block diagram further illustrating the processor and memory of FIG. 1 in another embodiment of the inventive concept. A processor 140 in FIG. 11 is configured identically with that in FIGS. 7 and 10, except it further comprises a register 247.

A register 247 may store information for an access period of the second storage area 243 as described with reference to FIG. 10. That is, it is understood that there is provided an access speed of the second storage area 243 optimized according to a deterioration state of the second storage area 243.

The register 247 stores information for an access period of the first storage area 241 in the memory 240. For example, the register 247 may store a number of executed program/erase cycles of the first storage area 241. The memory 240 may determine an access period with reference to the register 247. For example, if the number of executed program/erase cycles stored in the register 247 is less than a threshold value, the access period of the first storage area 241 may be shorter than an active period T1 (corresponding to one cycle of a clock CLK) of the chip selection signal CS. Although activated signals CS and RM are applied to the memory 240 from the processor 140, the Wait signal is not activated.

If the number of executed program/erase cycles stored in the register 247 is over the threshold value, the access period of the first storage area 241 may be longer than the active period T1 (corresponding to one cycle of the CLK) of the chip selection signal CS. The memory 240 activates the Wait signal in response to the activated signals CS and RM from the processor 140. The processor 140 adjusts the active period T1 (corresponding to one cycle of the CLK) of the chip selection signal CS. For example, the processor 140 controls the active period of the chip selection signal CS so as to have twice a period T2 (corresponding to two cycles of the CLK) as compared with an initial value T1 (corresponding to one cycle of the CLK).

That is, the memory 240 further comprises the register 247 for storing information for an access period of the first storage area 241. If the read source control signal RM indicating accessing to the first storage area 241, the memory 240 compares the access period of the first storage area 241 with the active period T1 (corresponding to one cycle of the CLK) of the chip selection signal CS to determine whether the Wait signal is activated.

As described above, the memory 240 further comprises the register 247. Thus, it is understood that the first storage area 241 is accessed although the access period of the first storage area 241 is longer than the active period T1 (corresponding to one cycle of the CLK) of the chip selection signal CS due to deterioration of the first storage area 241 storing code data. That is, it is understood that there is provided an access speed of the memory 240 optimized according to a deterioration state of the memory 240.

Figure 12:
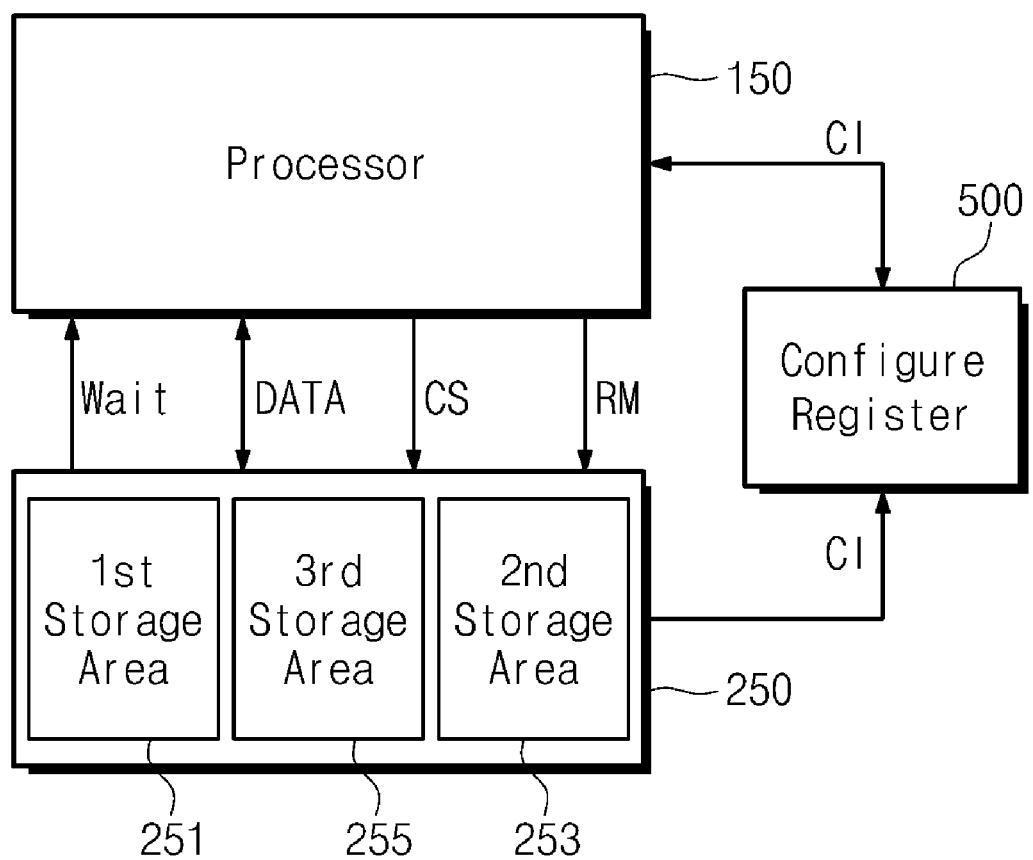
FIG. 12 is a block diagram further illustrating the processor and memory of FIG. 1 in still another embodiment of the inventive concept.

FIG. 12 is a block diagram further illustrating the processor and memory of FIG. 1 in another embodiment of the inventive concept. In FIG. 12, control signals CS, RM, and Wait exchanged between a processor 150 and a memory 250 are identical to those described with reference to FIGS. 2 to 12.

The memory 250 includes the first, second and third storage areas 251, 253, and 255. The first storage area 251 is a storage area allotted to store code data. The first storage area 251 may be set to store code data only. The second storage area 253 is a storage area assigned to store user data. The second storage area 253 may be set to store user data only. The third storage area 255 is a storage area to store code data or user data. A part of all of the third storage area 255 may be used as the first storage area 251. The remaining of the third storage area 255 may be used as the second storage area 253.

For example, the third storage area 255 may have the capacity of 256 KB. A part (for example, 128 KB) of the third storage area 255 may be configured to store code data (that is, it is used as the first storage area 251). The remaining (for example, 128 KB) of the third storage area 255 may be configured to store user data (that is, it is used as the second storage area 253).

Configuration data "CI" for the third storage area 255 may be stored in a configure register 500. For example, the configuration data CI of the third register 255 may be stored in either the first storage area 251 or the second storage area 253. The configuration data CI stored in the first or second storage area 251 or 253 may be loaded onto the register 500 at a power-on operation (that is, a power-on read operation). Alternatively, the register 500 may be a non-volatile memory device which stores the configuration data CI of the third storage area 255.

The processor 150 refers the configuration data CI of the third storage area 255 stored in the register 500 to determine whether or not to activate the read source control signal RM. For example, if the processor 150 accesses code data stored in the first storage area 251, the read source control signal RM may be maintained at an inactive state. If the processor 150 accesses code data stored in the third storage area 255, the read source control signal RM may be maintained at an inactive state. In the event that the processor 150 accesses user data stored in the second storage area 253, the read source control signal RM may be activated. If the processor 150 accesses user data stored in the third storage area 255, the read source control signal RM may be activated. That is, the processor 150 activates the read source control signal RM to access user data and inactivates the control signal RM to access code data.

For example, the register 500 may be an element of the processor 150. For example, the register 500 is directly accessed by the processor 150 and communicates with the memory 250 via a system bus 400 (refer to FIG. 1). For example, the register 500 may communicate the processor 150 and the memory 250 via the system bus 400. For example, the register 500 communicates with the memory 250 directly and with the processor 150 via the system bus 400. For example, the register 500 may be an element of the memory 250. It is understood that arrangement of the register 500 is not limited to the illustrated embodiment.

With the above-described embodiments, the present inventive concept is described with reference to a read operation of a memory in a computing system. But, it is understood that the present inventive concept is not limited to the read operation. For example, it is understood that the present inventive concept is applied to all types of access operations in which an access speed is varied due to deterioration of a memory.

With the above-described embodiments, the present inventive concept is described under the condition that a clock CLK is applied to a processor and a memory in a computing system. But, it is understood that the present inventive concept is not limited to the above-described condition. If a clock CLK is not supplied, the processor receives data from the memory after it issues a request for access to the memory and a time elapses. It is understood that when the present inventive concept is applied to such a case that the processor adjusts a predetermined time which is taken until a request for access is made and data is received.

The above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope is to be determined by the broadest permissible interpretation of the following claims and their equivalents, and shall not be restricted or limited to only the foregoing detailed description.

What is claimed is:

1. A computing system comprising:
a memory comprising a first storage area and a second storage area; and
a processor configured to send a memory control signal to the memory to define a data access period during which data is accessed, and a read source control signal indicating whether the first storage area or the second storage area is to be accessed during the data access period,
wherein the memory activates a wait signal in response to the memory access signal and the read source control signal, and the processor is further configured to receive the wait signal and in response thereto to adjust the duration of the data access period.

2. The computing system of claim 1, wherein a number of data bits stored in each memory cell of the first storage area is identical to a number of data bits stored in each cell of the second storage area.

3. The computing system of claim 1, wherein data access speed to the second storage area is slower than data access speed to the first storage area.

4. The computing system of claim 3, wherein the first storage area is configured to store only code data and the second storage area is configured to store only user data.

5. The computing system of claim 3, wherein the memory is further configured to deactivate the wait signal when a data access period for the second storage area is not longer than a data access period for the first storage area.

6. The computing system of claim 3, wherein the memory is further configured to activate the wait signal when a data access period for the second storage area is longer than a data access period for the first storage area.

7. The computing system of claim 3, wherein the memory further comprises a register configured to store data defining a data access period for at least one of the first and second storage areas.

8. The computing system of claim 7, wherein the memory is further configured to compare the data access period for the second storage area with reference data to determine whether or not to activate the wait signal.

9. The computing system of claim 3, wherein the processor is further configured to adjust the respective data access speeds for the first and second storage areas in relation to the wait signal.

10. The computing system of claim 9, wherein each one of the respective data access speeds is a function data access period defined by an integer multiple of a clock signal.

11. The computing system of claim 3, wherein the memory further comprises a third storage area configured for use as either the first storage area or the second storage area.

12. The computing system of claim 1, wherein the memory further comprises a register configured to store a number of executed program/erase cycles for memory cells in the second storage within the memory, and wherein when the second area is to be accessed and the number of executed program/erase cycles stored in the register is less than a defined threshold value then the wait signal is not activated, and wherein when the second area is to be accessed and the number of executed program/erase cycles stored in the register is greater than the defined threshold value then the wait signal is activated.

13. A computing system comprising:
a memory comprising memory cells operating in a normal state when a number of executed program/erase operations is less than a threshold value, and operating in a deteriorated state when the number of executed program/erase operations is greater than the threshold value; and
a processor configured to control overall operation of the memory,
wherein the processor defines a normal data access period when the memory cells are operating in the normal state and an extended data access period when the memory cells are operating in the deteriorated state,
the normal data access period being defined in relation to a chip selection signal provided by the processor, and
the extended data access period being defined in relation to the chip selection signal and a wait signal returned to the processor from the memory when the memory cells are operating in the deteriorated state.

14. The computing system of claim 13, wherein the memory cells are divided between a first storage area and a second storage area, and a number of data bits stored in each memory cell of the first storage area is identical to a number of data bits stored in each cell of the second storage area.

15. The computing system of claim 14, wherein the first storage area is configured to store only code data and the second storage area is configured to store only user data.

16. The computing system of claim 15, wherein the memory cells in the second storage area are operating in the deteriorated state and memory cells in the first storage area are operating in the normal state.

17. The computing system of claim 16, wherein the processor is further configured to provide a read source control signal to the memory indicating whether a data access operation is directed to the first storage area or the second storage area.

18. The computing system of claim 17, wherein the wait signal is returned to the processor from the memory when the read source control signal indicates that the data access operation is directed to the second storage area.

19. The computing system of claim 13, wherein the memory further comprises a register configured to store the number of executed program/erase cycles.

* * * * *